United States Patent [19]

Suzuki

[11] Patent Number: 5,252,843
[45] Date of Patent: Oct. 12, 1993

[54] SEMICONDUCTOR DEVICE HAVING OVERLAPPING CONDUCTOR LAYERS

[75] Inventor: Masahisa Suzuki, Tokyo, Japan

[73] Assignee: Fujitsu Limited, Kanagawa, Japan

[21] Appl. No.: 809,041

[22] Filed: Dec. 16, 1991

Related U.S. Application Data

[63] Continuation of Ser. No. 573,758, Aug. 28, 1990, abandoned.

[30] Foreign Application Priority Data

Sep. 1, 1989 [JP] Japan ................................. 1-227214
Jan. 17, 1990 [JP] Japan ..................................... 2-7868

[51] Int. Cl.$^5$ .................... H01L 29/80; H01L 31/112
[52] U.S. Cl. ................................ 257/284; 257/280; 257/282; 257/283
[58] Field of Search ................... 357/22 I, 22 K, 22 J, 357/22 L, 22 GR, 22 LA, 22 P, 22 S, 22; 437/175, 176, 184; 257/280, 282, 283, 284

[56] References Cited

U.S. PATENT DOCUMENTS

| | | | |
|---|---|---|---|
| 4,201,997 | 5/1980 | Darley et al. | 357/15 |
| 4,202,003 | 5/1980 | Darley et al. | 357/22 J |
| 4,606,113 | 8/1986 | Rode | 437/176 |
| 4,701,646 | 10/1987 | Richardson | 357/22 I |
| 4,709,251 | 11/1987 | Suzuki | 357/22 K |
| 4,782,032 | 11/1988 | Geissberger et al. | 437/176 |
| 4,814,835 | 3/1989 | Tung | 357/22 I |
| 4,902,635 | 8/1990 | Imamura et al. | 437/176 |
| 5,121,174 | 6/1992 | Forgerson, II et al. | 357/22 |

FOREIGN PATENT DOCUMENTS

| | | |
|---|---|---|
| 118709 | 9/1984 | European Pat. Off. . |
| 257948 | 3/1988 | European Pat. Off. . |
| 259490 | 3/1988 | European Pat. Off. . |
| 3706274 | 9/1987 | Fed. Rep. of Germany . |
| 55-117283 | 9/1980 | Japan ................. 357/22 S |
| 58-6179 | 1/1983 | Japan . |
| 58-199567 | 11/1983 | Japan . |
| 61-67274 | 4/1986 | Japan ................. 437/184 |
| 61-189670 | 8/1986 | Japan ................. 357/22 |
| 61-190987 | 8/1986 | Japan ................. 357/22 |
| 62-112377 | 5/1987 | Japan ................. 357/22 |
| 62-156876 | 7/1987 | Japan ................. 357/22 |
| 63-47952 | 2/1988 | Japan . |
| 63-128673 | 6/1988 | Japan ................. 357/22 |
| 64-1277 | 1/1989 | Japan ................. 437/184 |
| 1-227478 | 9/1989 | Japan ................. 357/22 |

OTHER PUBLICATIONS

IBM Technical Disclosure Bulletin, vol. 22 No. 7, Dec. 1979, "Self-Aligned Silicon MESFET or JFET" by Ning et al, pp. 2918-2921.

"A New Refractory Self-Aligned Gate Technology For GaAs Microwave Power FET's and MMIC's", Geissberger et al, 8093 IEEE Transactions on Electron Devices, vol. 35, No. 5, May 1988, New York, pp. 615-622.

Primary Examiner—Rolf Hille
Assistant Examiner—Steven Loke
Attorney, Agent, or Firm—Nikaido, Marmelstein, Murray & Oram

[57] ABSTRACT

A semiconductor device includes a semiconductor substrate, an active layer formed on the semiconductor substrate, source and drain electrodes respectively formed on the active layer, a gate electrode formed on the active layer between the source and drain electrodes and including a gate contact portion which makes contact with the active layer and has a thickness greater than those of the source and drain electrodes and an overgate portion which is connected to the gate contact portion and extends over at least a portion of one of the source and drain electrodes, a first insulator layer formed on the active layer and covering the source and drain electrodes and the gate contact portion, a first contact hole in the first insulator layer through which the overgate portion connects to the one of the source and drain electrodes, a second insulator layer formed on the first insulator layer and covering the overgate portion, a second contact hole in the second insulator layer at a position above the overgate portion, and an interconnection layer formed on the second insulator layer and connected to the overgate portion via the second contact hole.

12 Claims, 10 Drawing Sheets

SEMICONDUCTOR DEVICE HAVING OVERLAPPING CONDUCTOR LAYERS

This application is continuation of application Ser. No. 573,758 filed Aug. 28, 1990 now abandoned.

BACKGROUND OF THE INVENTION

The present invention generally relates to semiconductor devices and methods of producing semiconductor devices, and more particularly to a semiconductor device which uses a compound semiconductor such as GaAs and a method of producing such a semiconductor device.

Compared to the metal oxide semiconductor (MOS) semiconductor devices which use silicon, the semiconductor device which uses a compound semiconductor can operate at a high speed and there is active research on the semiconductor device which uses the compound semiconductor. The aim of the research is to shorten the gate length so as to increase the operation speed and to reduce the size of elements so as to improve the integration density.

For a digital circuit which is formed in the semiconductor device which uses the compound semiconductor, a direct coupled field effect transistor logic (DCFL) circuit is generally used to improve the integration density. An inverter circuit which forms a basic circuit of the DCFL circuit is shown in FIG. 1.

The inverter circuit shown in FIG.1 includes an enhancement type FET 2 and a depletion type FET 4 which is connected to the FET 2 as a load. A source S of the FET 2 is grounded, and a drain D of the FET 2 is connected to a source S of the FET 4. A gate G of the FET 4 is connected to the source S of the FET 4, and a power source voltage $V_{DD}$ is applied to a drain D of the FET 4. An input signal $V_{IN}$ is applied to a gate G of the FET 2, and an output signal $V_{OUT}$ which is an inverted signal of the input signal $V_{IN}$ is output from a node which connects the drain D of the FET 2 and the source S of the FET 4.

FIGS. 2A and 2B show the conventional inverter circuit shown in FIG. 1 with shortened gate length for the purpose of increasing the operation speed. FIG. 2A is a plan view of the conventional inverter circuit, and FIG. 2B is a cross sectional view along a line A—A' in FIG. 2A.

In FIG. 2B, an intrinsic GaAs buffer layer 12 is formed on a semiinsulative GaAs substrate 10, and an n-type GaAs active layer 14 is formed on the intrinsic GaAs buffer layer 12. An element forming region is defined by an isolation region 16 which is formed by implanting oxygen ions. A source electrode 18, a common electrode 19 and a drain electrode 20 are formed on the n-type active layer 14. A gate electrode 22 of the enhancement type FET 2 is formed between the source electrode 18 and the common electrode 19, and a gate electrode 23 of the depletion type FET 4 is formed between the common electrode 19 and the drain electrode 20. The common electrode 19 is used as a drain electrode of the FET 2 and also as a source electrode of the FET 4.

The lower portions of the gate electrodes 22 and 23 have a recess structure in the n-type GaAs active layer 14. The recess of the gate electrode 22 is slightly deeper than the recess of the gate electrode 23.

In the conventional inverter circuit, the gate electrodes 22 and 23 are made narrow and the cross sectional areas thereof are small so as to shorten the gate length. On the other hand, in the DCFL circuit which can realize the high-speed operation and high integration density, a relative large current flows at the gate electrode 22. For this reason, the current density of the current flowing through the gate electrode 22 becomes extremely large when increasing the operation speed, and there is a problem in that the reliability of the element becomes poor.

In addition, as may be seen from FIG. 2A, various measures must be taken to input the input signal $V_{IN}$ to the conventional inverter circuit. Such measures include extending the gate electrode 22 of the FET 2 outside the element forming region and forming a contact hole in the extended portion, providing an interconnection layer 24 outside the element forming region to connect the gate electrode 23 of the FET 4 and the common electrode 19, and forming a contact hole in the interconnection layer 24 for outputting the output signal $V_{OUT}$. Hence, the conventional inverter circuit requires a region outside the element forming region for providing contact holes and interconnections, and there is a problem in that it is difficult to improve the integration density.

SUMMARY OF THE INVENTION

Accordingly, it is a general object of the present invention to provide a novel and useful semiconductor device and method of producing the semiconductor device, in which the problems described above are eliminated.

Another and more specific object of the present invention is to provide a semiconductor device comprising a semiconductor substrate, an active layer formed on the semiconductor substrate, a source electrode and a drain electrode respectively formed on the active layer, a gate electrode formed on the active layer between the source and drain electrodes, where the gate electrode includes a gate contact portion which makes contact with the active layer and has a thickness greater than those of the source and drain electrodes and an overgate portion which is connected to the gate contact portion and extends over at least a portion of one of the source and drain electrodes, and an insulator layer formed on the active layer and covering the source and drain electrodes and the gate contact portion, where the insulator layer has a contact hole through which the overgate portion connects to the one of the source and drain electrodes. According to the semiconductor device of the present invention, it is possible to increase the cross sectional area of the gate electrode having a short gate length without increasing the source resistance. It is also possible to reduce the current density of the current flowing through the gate without deteriorating the characteristic of the element. Furthermore, it is possible to connect the electrodes to desired interconnection layers over the element forming region, without the need for a region exclusively for making the contacts. Therefore, it is possible to greatly improve the integration density of the semiconductor device.

Still another object of the present invention is to provide a semiconductor device comprising a semiconductor substrate, an active layer formed on the semiconductor substrate, first, second and third electrodes respectively formed on the active layer, a first gate electrode formed on the active layer between the first and second electrodes, the first gate electrode and the first and second electrodes forming electrodes of a first field effect transistor, where the first gate electrode includes a first gate contact portion which makes contact with the active layer and has a thickness greater than those of the first and second electrodes and a first overgate portion which is connected to the first gate contact portion and extends over at least a portion of the first electrode, a second gate electrode formed on the active layer between the second and third electrodes, where the second gate electrode and the second and third electrodes form electrodes of a depletion type field effect transistor and the second gate electrode includes a second gate contact portion which makes contact with the active layer and has a thickness greater than those of the second and third electrodes and a second overgate portion which is connected to the second gate contact portion and extends over at least a portion of the second electrode, and an insulator layer formed on the active layer and covering the first through third electrodes and the first and second gate contact portions, where the insulator layer has a contact hole through which the second overgate portion connects to the second electrode.

A further object of the present invention is to provide a method of producing a semiconductor device comprising the steps of preparing a stacked structure including a semiconductor substrate, an active layer formed on the semiconductor substrate, a source electrode and a drain electrode respectively formed on the active layer, a gate contact portion formed on the active layer between the source and drain electrodes, where the gate contact portion has a thickness greater than those of the source and drain electrodes, and an insulator layer formed on the active layer and covering the source and drain electrodes and a side surface of the gate contact portion so that a top surface of the gate contact portion is exposed, forming a first contact hole in the insulator layer directly above one of the source and drain electrodes, and forming an overgate portion on the insulator layer which extends over at least a portion of the other of the source and drain electrodes and connects to the one of the source and drain electrodes via the first contact hole, where the overgate portion is connected to the gate contact portion to form a gate electrode. According to the method of the present invention, it is possible to connect the electrodes to desired interconnection layers over the element forming region without the need to provide a special region exclusively for making the contacts.

Another object of the present invention is to provide a method of producing a semiconductor device comprising the steps of preparing a stacked structure including a semiconductor substrate, an active layer formed on the semiconductor substrate, first, second and third electrodes respectively formed on the active layer, first and second gate contact portions formed on the active layer respectively between the first and second electrodes and between the second and third electrodes, where the first and second gate contact portions have a thickness greater than those of the first through third electrodes, and an insulator layer formed on the active layer and covering the first through third electrodes and side surfaces of the first and second gate contact portions so that top surfaces of the first and second gate contact portions are exposed, forming a first contact hole in the insulator layer directly above the second electrode, and forming first and second overgate portions on the insulator layer, where the first overgate portion extends over at least a portion of the first electrode, the second overgate portion extends over at least a portion of the second electrode and connecting to the second electrode via the first contact hole, the first overgate portion is connected to the first gate contact portion to form a first gate electrode and the second overgate portion is connected to the second gate contact portion to form a second gate electrode.

Still another object of the present invention is to provide a method of producing a semiconductor device comprising the steps of forming a plurality of field effect transistor parts in an array on an active layer which is formed on a substrate, where each of the field effect transistors include a source electrode, a drain electrode and a gate contact portion, and coupling arbitrary ones of the field effect transistor parts by forming overgate portions which make contact with corresponding gate contact portions of the field effect transistor parts, where each of the overgate portions extend over at least a portion of one of the source and drain electrodes of a corresponding one of the field effect transistor parts. According to the method of the present invention, the present invention can be applied to a gate array type semiconductor device to increase the degree of freedom of designing interconnections to realize a desired function.

Other objects and further features of the present invention will be apparent from the following detailed description when read in conjunction with the accompanying drawings.

DESCRIPTION OF THE PREFERRED EMBODIMENTS

Figure 1:
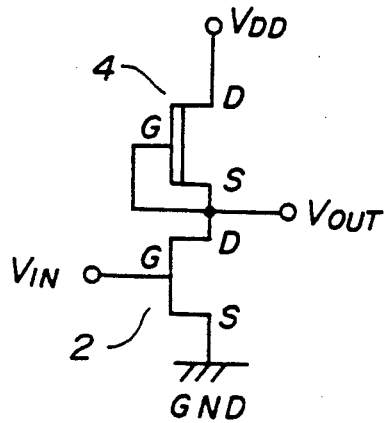
FIG. 1 is a circuit diagram showing a conventional inverter circuit.
Figure 2A:
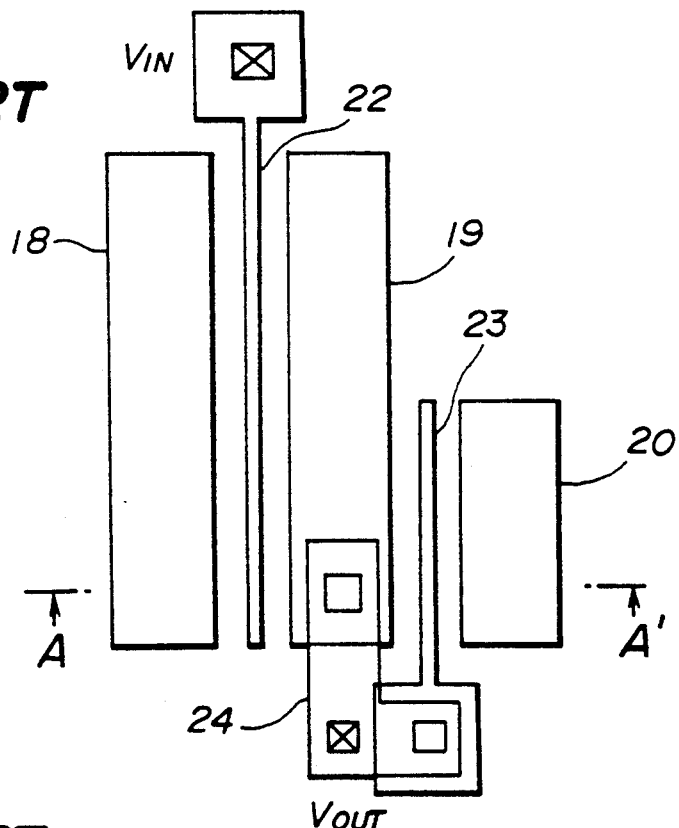
FIGS. 2A and 2B are a plan view and a cross sectional view respectively showing the conventional inverter circuit shown in FIG. 1.
Figure 2B:
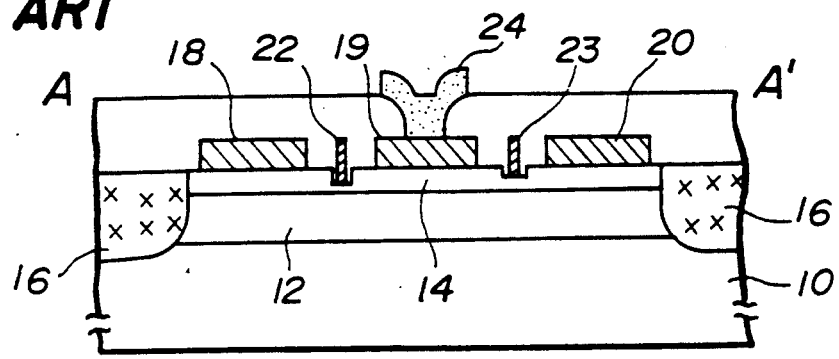
Figure 3A:
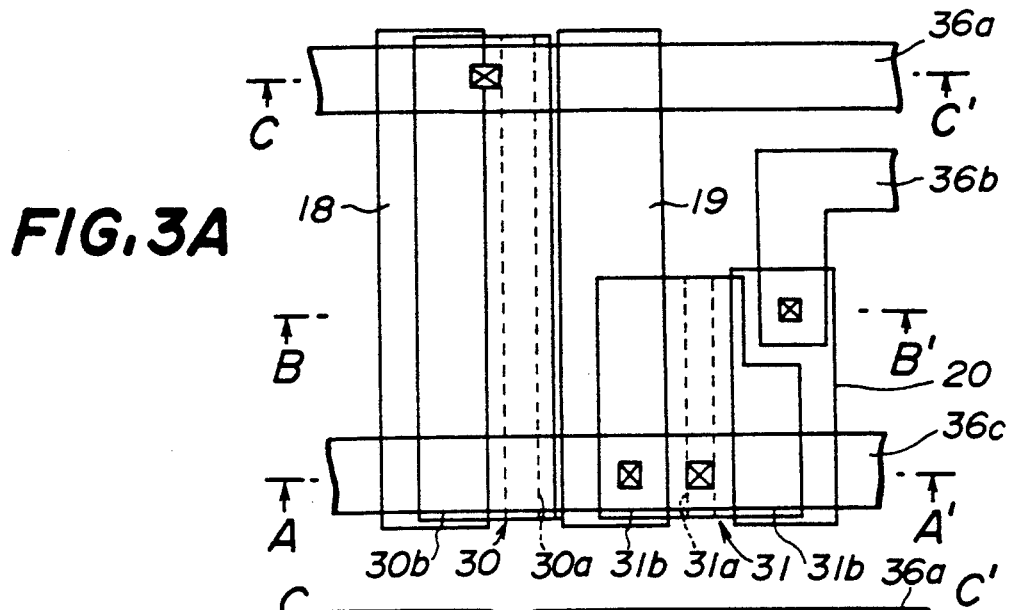
FIG. 3A is a plan view showing an essential part of a first embodiment of a semiconductor device according to the present invention.
Figure 3B:
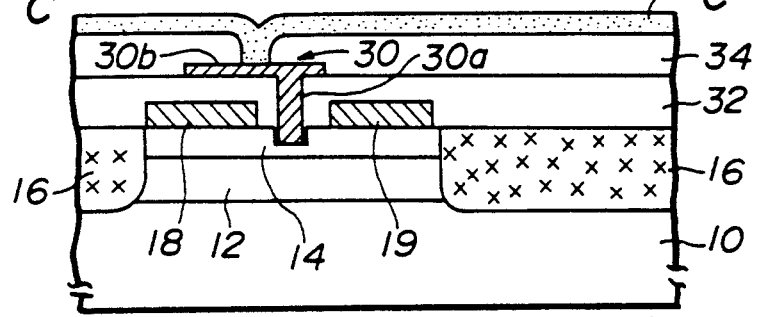
FIGS. 3B through 3D are cross sectional views respectively showing the first embodiment at various parts shown in FIG. 3A.
Figure 3C:
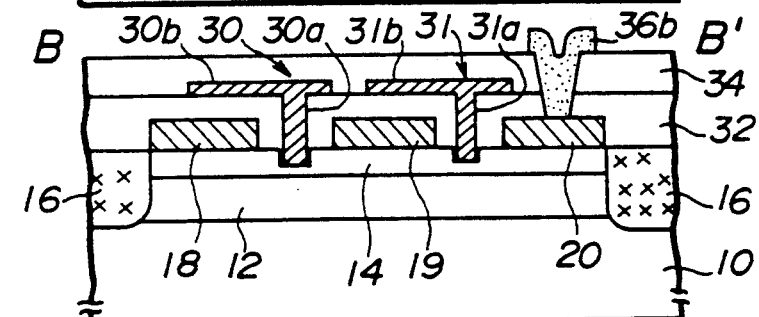
Figure 3D:
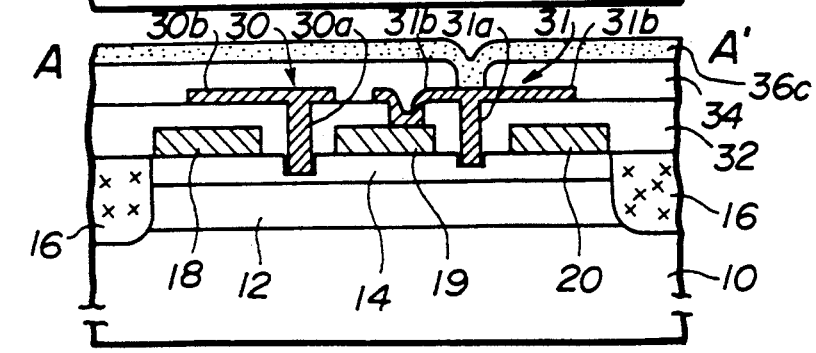

First, a description will be given of a first embodiment of a semiconductor device according to the present invention, by referring to FIGS. 3A through 3D. FIG. 3A is a plan view of the first embodiment. FIG. 3B is a cross sectional view of the first embodiment along a line C—C' in FIG. 3A, FIG. 3C is a cross sectional view of the first embodiment along a line B—B' in FIG. 3A, and FIG. 3D is a cross sectional view of the first embodiment along a line A—A' in FIG. 3A. In FIGS. 3A through 3D, those parts which are basically the same as those corresponding parts in FIGS. 1, 2A and 2B are designated by the same reference numerals, and a detailed description thereof will be omitted. In this embodiment, the present invention is applied to the inverter having the circuit construction shown in FIG. 1.

In this embodiment, an intrinsic GaAs buffer layer 12 and an n-type GaAs active layer 14 are successively formed on a semiinsulative GaAs substrate 10, and an element forming region is defined by an isolation region 16. A gate electrode 30 is formed on the n-type GaAs active layer 14 between a source electrode 18 (first electrode) and a common electrode 19 (second electrode), and a gate electrode 31 is formed on the n-type GaAs active layer 14 between the common electrode 19 and a drain electrode 20 (third electrode). These gate electrodes 30 and 31 form an essential part of this embodiment.

The gate electrode 30 of an enhancement type FET 2 is made up of a gate contact portion 30a and an overgate portion 30b and has a T-shaped cross section. The gate contact portion 30a makes contact with the n-type GaAs active layer 14 between the source electrode 18 and the common electrode 19. The overgate portion 30b connects to an upper part of the gate contact portion 30a and extends mainly above the left source electrode 18 via an insulator layer 32.

The gate electrode 31 of a depletion type FET 4 is made up of a gate contact portion 31a and an overgate portion 31b and has a T-shaped cross section. The gate contact portion 31a makes contact with the n-type GaAs active layer 14 between the common electrode 19 and the drain electrode 20. The overgate portion 31b connects to an upper part of the gate contact portion 31a and extends above the common electrode 19 and the drain electrode 20 to the right and left via the insulator layer 32.

In this embodiment, a contact hole is formed in the insulator layer 32 above the common electrode 19 as shown in FIG. 3D, and the overgate portion 31b connects to the common electrode 19 via this contact hole. In other words, this embodiment is characterized in that the overgate portion 31b increases the cross sectional area of the gate electrode 31 and also connects the gate electrode 31 of the FET 4 to the common electrode 19 which is used as the source electrode of the FET 4.

An interconnection layer 36 is formed over the overgate portion 31b via an insulator layer 34. The interconnection layer 36 is made up of interconnection layers 36a, 36b and 36c. The interconnection layer 36a is provided to input the input signal and makes contact with the overgate portion 30b of the gate electrode 30 of the FET 2 as shown in FIG. 3B. The interconnection layer 36b is provided to apply the power source voltage $V_{DD}$, and makes contact with the drain electrode 20 of the FET 4 as shown in FIG. 3C. The interconnection layer 36c is provided to output the output signal $V_{OUT}$, and makes contact with the overgate portion 31b of the gate electrode 31 of the FET 4. In other words, because the overgate portions 30b and 31b of the respective gate electrodes 30 and 31 are wide in this embodiment, it is possible to make contact with the interconnection layer 36 via a contact hole above the element forming region.

For example, the electrodes 18, 19 and 20 may be made of a AuGe/Au layer having a thickness of 0.3 μm, where the AuGe and Au parts of the AuGe/Au layer respectively have thicknesses of 0.02 μm and 0.28 μm. The gate contact portions 30a and 31a may be made of an Al layer having a thickness of 0.6 μm. In addition, the overgate portions 30b and 31b may be made of a Ti/TiN/Pt/Au layer having a thickness of 0.3 μm, where the Ti, TiN, Pt and Au parts of the Ti/TiN/Pt/Au layer respectively have thicknesses of 0.02 μm, 0.07 μm, 0.01 μm and 0.2 μm.

According to this embodiment, the overgate portion of the gate electrode exists in a layer above the source electrode, the common electrode and the drain electrode. For this reason, there is no need to take measures so that the overgate portion does not make contact with the source electrode, the common electrode and the drain electrode. As a result, the source electrode, the common electrode and the drain electrode can be positioned close to the gate contact portion. Accordingly, even when the overgate portion is provided to increase the cross sectional area of the gate electrode, the source resistance will not increase to deteriorate the element characteristic.

In addition, according to this embodiment, it is possible to connect the gate electrode and the source electrode without providing a special region realizing the contact, because the overgate portion makes contact with the source electrode which is provided immediately below the overgate portion.

Furthermore, according to this embodiment, because the overgate portion of the gate electrode is wide, it is possible to make contact with the upper interconnection layer via a contact hole above the element forming region without the need to provide a special region for realizing the contact.

In this embodiment, it is assumed for the sake of convenience that the first electrode is the source electrode and the third electrode is the drain electrode. However, it is of course possible to consider the drain electrode as the first electrode and the source electrode as the third electrode.

Next, a description will be given of a first embodiment of a method of producing the semiconductor device according to the present invention, by referring to FIGS. 4A through 4L. In this embodiment of the method, the first embodiment of the semiconductor device shown in FIGS. 3A through 3D is produced. In FIGS. 4A through 4L, those parts which are the same as those corresponding parts in FIGS. 3A through 3D are designated by the same reference numerals, and a description thereof will be omitted.

Figure 4A:
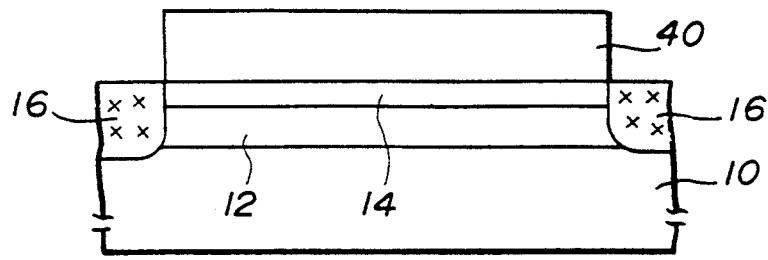
FIGS. 4A through 4L are cross sectional views for explaining a first embodiment of a method of producing a semiconductor device according to the present invention.

As shown in FIG. 4A, the intrinsic GaAs buffer layer 12 having a thickness of approximately 10000 Å and the n-type GaAs active layer 14 having a thickness of approximately 2000 Å A and an impurity density of $5.0 \times 10^{17}$ cm$^{-3}$ are successively grown epitaxially on the semiinsulative GaAs substrate 10. Next, the element forming region is masked by a resist layer 40 having a thickness of approximately 1.5 μm, and oxygen ions are implanted with a dosage of $2.0 \times 10^{12}$ cm$^{-2}$ and a power of 150 keV so as to form the isolation region 16 outside the element forming region.

Figure 4B:
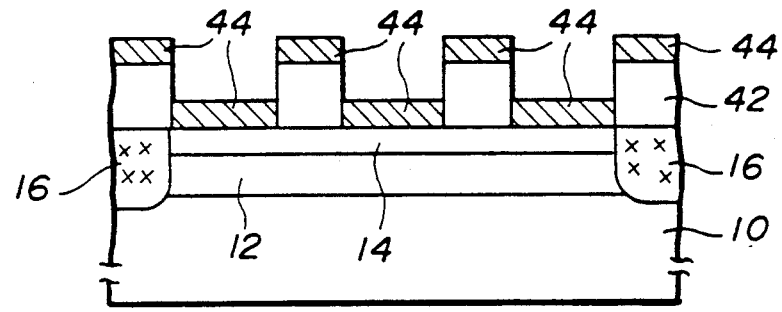

Then, as shown in FIG. 4B, a resist layer 42 is formed by coating a photoresist or an electron beam resist and this resist layer 42 is patterned into a predetermined shape. The patterned resist layer 42 is used as a mask for forming the source electrode ,(first electrode), the common electrode (second electrode) and the drain electrode (third electrode). A AuGe/Au layer 44 having a thickness of approximately 3000 Å is deposited by a vacuum vapor deposition. After the deposition of the AuGe/Au layer 44, the resist layer 42 is removed to lift off unwanted portions of the AuGe/Au layer 44. Thereafter, the remaining portions of AuGe/Au layer 44 are metallized by a thermal process at 450° for approximately 1 minute. As a result, the source electrode 18, the common electrode 19 and the drain electrode 20 which make ohmic contact with the n-type GaAs active layer 14 are formed.

Figure 4C:
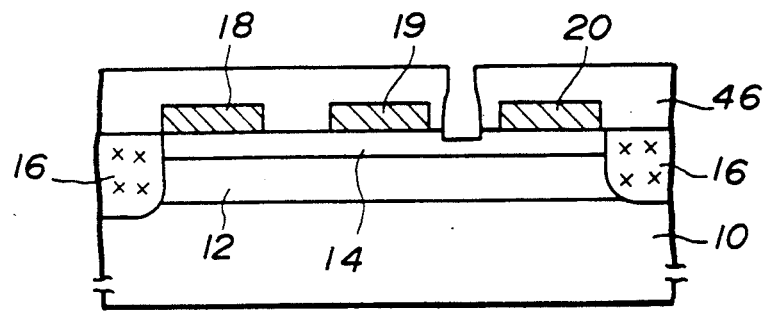

Next, as shown in FIG. 4C, a resist layer 46 is formed by coating an electron beam resist, and an aperture pattern having a width of approximately 0.2 μm is made for the formation of the gate electrode 31 of the FET 4. Thereafter, the n-type GaAs active layer 14 is etched approximately 1000 Å using HF, $H_2O_2$ and $H_2O$ as etchants so as to form a first recess at a portion where the gate electrode 31 is formed in a latter stage. The first recess may also be formed by a reactive ion etching (RIE) using flon 12 ($CCl_2F_2$) as the etchant.

Figure 4D:
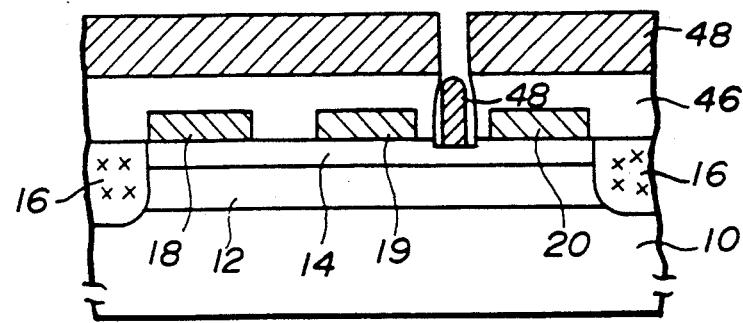

Then, as shown in FIG. 4D, the resist layer 46 is used as a mask, and an aluminum (Al) layer 48 is deposited to a thickness of approximately 6000 Å by a vapor deposition. The Al layer 48 is formed on the resist layer 46 and on the first recess portion of the n-type GaAs active layer 14.

Figure 4E:
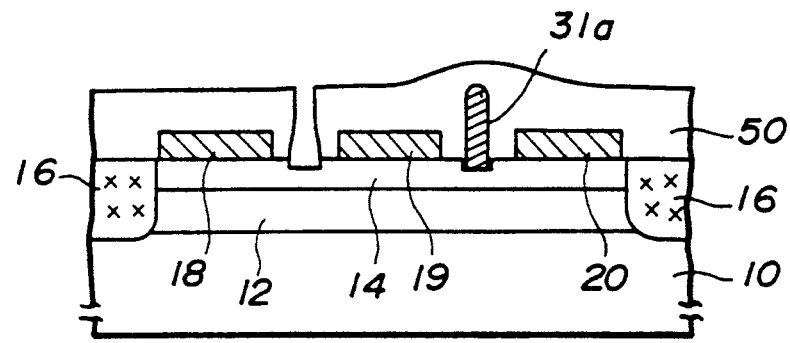

When the resist layer 46 is removed to lift off unwanted portions of the Al layer 48, the gate contact portion 31a is formed as shown in FIG. 4E. A tip end of this gate contact portion 31a is located at a position higher that those of the source electrode 18, the common electrode 19 and the drain electrode 20. Then, a resist layer 50 is formed by coating an electron beam resist, and an aperture pattern having a width of approximately 0.2 μm is made for the formation of the gate electrode 30 of the FET 2. Thereafter, the n-type GaAs active layer 14 is etched approximately 1400 Å using HF, $H_2O_2$ and $H_2O$ as etchants so as to form a second recess at a portion where the gate electrode 30 is formed in a latter stage. This second recess for the gate electrode 30 is slightly deeper than the first recess for the gate electrode 31.

Figure 4F:
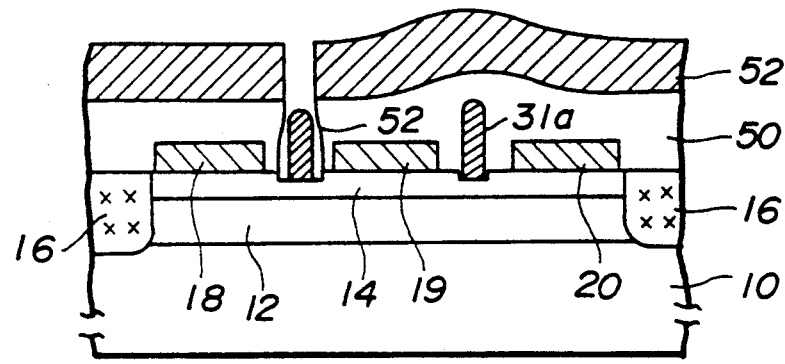

Next, as shown in FIG. 4F, the resist layer 50 is used as a mask, and an Al layer 52 is deposited to a thickness of approximately 6000 Å by a vapor deposition. The Al layer 52 is formed on the resist layer 50 and on the second recess portion of the n-type GaAs active layer 14.

Figure 4G:
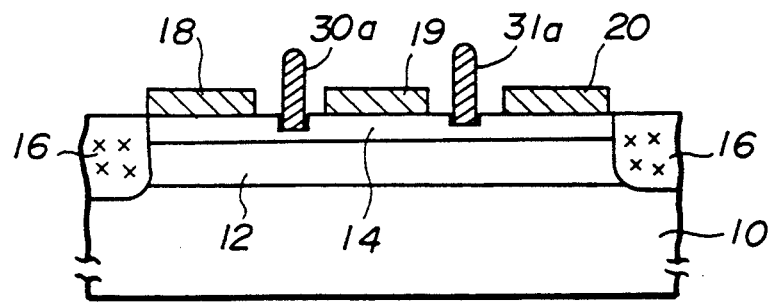

When the resist layer 50 is removed to lift off unwanted portions of the Al layer 52, the gate contact portion 30a is formed as shown in FIG. 4G. A tip end of this gate contact portion 30a is located at a position higher that those of the source electrode 18, the common electrode 19 and the drain electrode 20, similarly as in the case of the gate contact portion 31a.

The layer 52 is not limited to the Al layer. For example, a Ti/Pt/Au layer having a thickness of 1000/1000/400 Å or a Ti/Mo/Au layer having a thickness of 1000/1000/400 Å may be used as the layer 52.

Figure 4H:
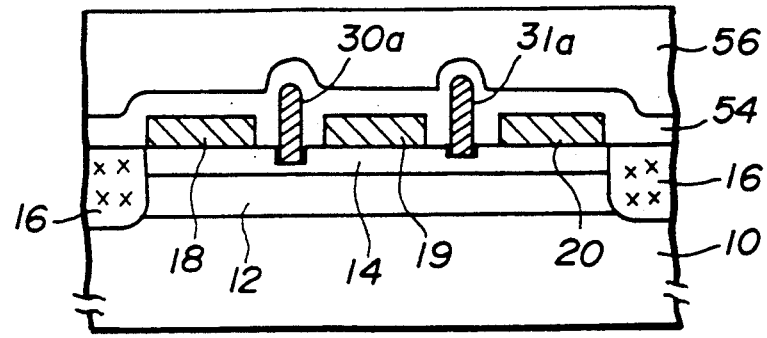

Next, a silicon dioxide ($SiO_2$) layer 54 is formed by a chemical vapor deposition (CVD), and a resist layer 56 is formed on the $SiO_2$ layer 54 to flatten the surface as shown in FIG. 4H.

Figure 4I:
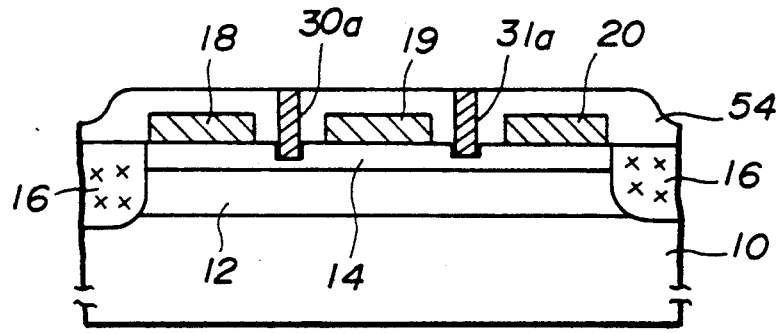

Then, a gas mixture of $CF_4$ and $O_2$ is used as an etching gas to etch back until only the tip ends of the gate contact portions 30a and 31a become exposed as shown in FIG. 4I. This etch back is carried out under an etching condition such that the etching rates of the $SiO_2$ layer 54 and the resist layer 56 become the same.

Figure 4J:
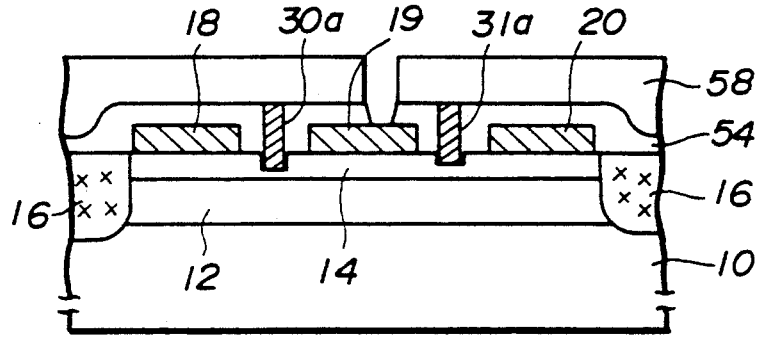

Thereafter, a resist layer 58 is formed on the entire exposed surface and the resist layer 58 is patterned so as to form a contact hole in the $SiO_2$ layer 54 above the common electrode 19 as shown in FIG. 4J.

Figure 4K:
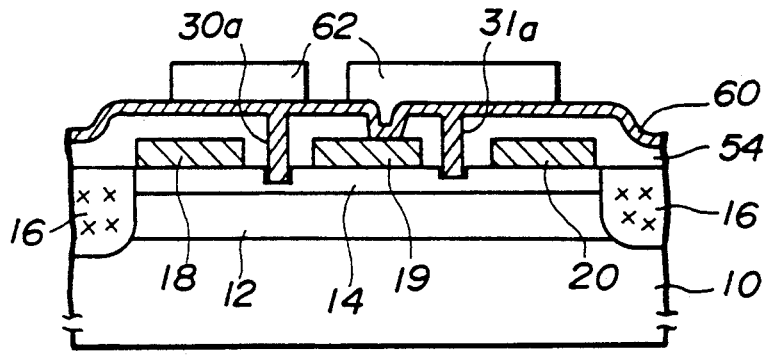

Furthermore, Ti/TiN/Pt/Au layer 60 is formed on the entire exposed surface to a thickness of approximately 2000 Å by a vapor deposition or sputtering as shown in FIG. 4K. It is of course possible to form a Ti/Pt/Au layer by a vapor deposition or sputtering. Then, a resist layer 62 is formed on the layer 60, and this resist layer 62 is patterned so that portions of the resist layer 62 remain at parts where the overgate portions 30b and 31b are to be formed in a latter stage.

Figure 4L:
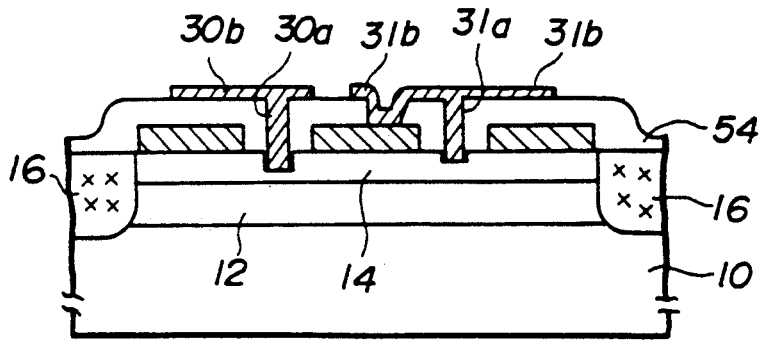

The resist layer 62 is used as a mask when etching the layer 60, and the resist layer 62 is removed thereafter. As a result, the overgate portions 30b and 31b are formed as shown in FIG. 4L. As shown, the overgate portion 30b connects to the upper part of the gate contact portion 30a and extends to a part above the source electrode 18 on the $SiO_2$ layer 54. On the other hand, the overgate portion 31b connects to the upper part of the gate contact portion 31a and extends to a part above the common electrode 19 and the drain electrode 20 on the $SiO_2$ layer 54. The overgate portion 31b makes contact with the common electrode 19.

Next, the $SiO_2$ layer 34 is formed on the entire exposed surface by a CVD. A contact hole which reaches the overgate portion 30b as shown in FIG. 3B, a contact hole which reaches the drain electrode 20 as shown in FIG. 3C, and a contact hole which reaches the overgate portion 31b as shown in FIG. 3D are formed in the $SiO_2$ layer 34. Thereafter, the Ti/Pt/Au interconnection layer 36 is formed on the entire exposed surface by a vapor deposition or sputtering. The interconnection layer 36 is patterned by an Ar ion milling so as to form the interconnection layer 36a shown in FIG. 3B, the interconnection layer 36b shown in FIG. 3C and the interconnection layer 36c shown in FIG. 3D.

According to this embodiment of the method, the overgate portion is provided in a layer above the layer in which the source electrode, the common electrode and the drain electrode are provided. For this reason, it is possible to maintain a sufficiently large alignment margin, thereby facilitating the production of the semiconductor device.

Next, a description will be given of essential steps of a second embodiment of the method of producing the semiconductor device according to the present invention. In this second embodiment of the method, after forming the gate contact portions 30a and 31a as shown in FIG. 4G, an OCD resin layer, for example, is formed by a spin coating instead of forming the SiO$_2$ layer 54 in the steps shown in FIGS. 4H and 4I. The OCD resin layer is etched back until the tip ends of the gate contact portions 30a and 31a become exposed. The steps shown in FIG. 4J and after in this second embodiment are basically the same as those of the first embodiment of the method.

Figure 5A:
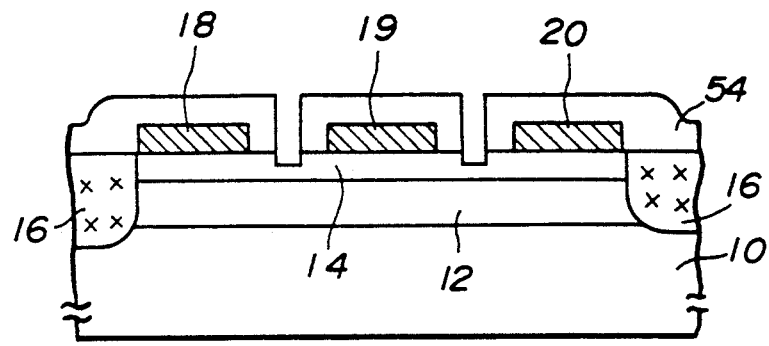
FIGS. 5A through 5B are cross sectional views for explaining a third embodiment of the method of producing the semiconductor device according to the present invention.
Figure 5B:
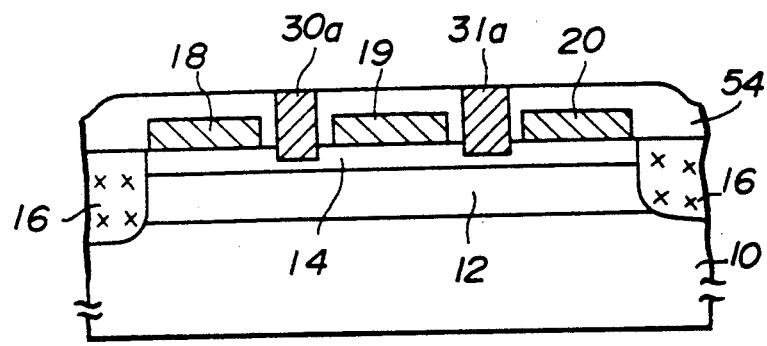

Next, a description will be given of essential steps of a third embodiment of the method of producing the semiconductor device according to the present invention. In this third embodiment of the method, after the step described in conjunction with FIG. 4B, the SiO$_2$ layer 54 is formed as shown in FIG. 5A and holes are formed in the SiO$_2$ layer 54 at the parts corresponding to the positions where the gate contact portions 30a and 31b are formed in a latter stage. Then, as shown in FIG. 5B, a tungsten (W) layer 64 is formed inside the holes by a CVD using a gas mixture of SiH$_4$/WF$_6$=1 at a total pressure of 0.3 Torr and a temperature of 250° C. This state shown in FIG. 5B is the same as the state shown in FIG. 4I, and the steps shown in FIG. 4J and after in this third embodiment are basically the same as those of the first embodiment of the method.

Figure 6A:
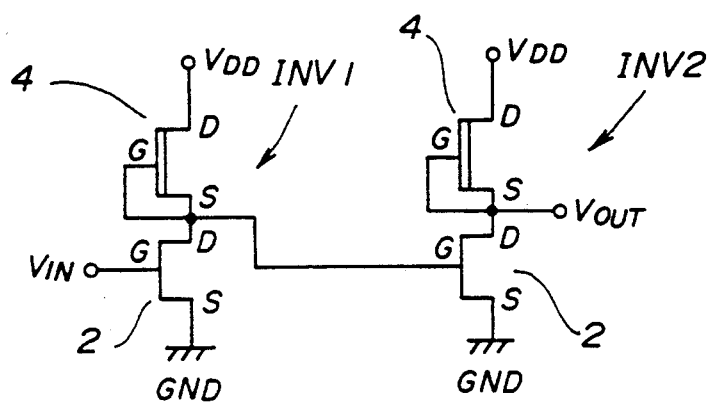
FIGS. 6A and 6B respectively are a circuit diagram and a plan view showing a second embodiment of the semiconductor device according to the present invention.
Figure 6B:
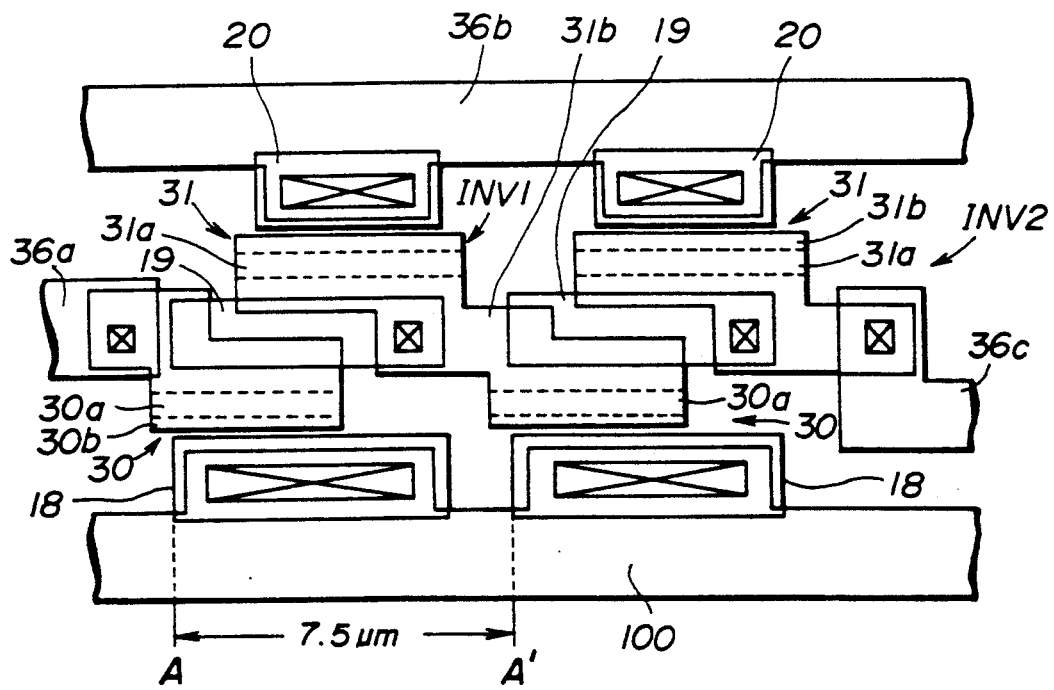

Next, a description will be given of a second embodiment of the semiconductor device according to the present invention, by referring to FIGS. 6A and 6B. In this embodiment, the present invention is applied to a ring oscillator. FIG. 6A is a circuit diagram showing a ring oscillator, and FIG. 6B is a plan view of the ring oscillator shown in FIG. 6A. In FIGS. 6A and 6B, those parts which are essentially the same as those corresponding parts in FIGS. 3A through 3D are designated by the same reference numerals, and a detailed description thereof will be omitted.

The ring oscillator shown in FIG. 6A includes DCFL inverter circuits INV1 and INV2 which are connected in two stages. A node which connects the drain D of the enhancement type FET 2 and the source S of the depletion type FET 4 of the first stage is connected to a gate G of the enhancement type FET 2 of the second stage. In other words, the inverted output signal from the DCFL inverter circuit INV1 of the first stage is supplied as the input signal of the DCFL inverter circuit INV2 of the second stage, and an output signal of the DCFL inverter circuit INV2 of the second stage is obtained from a node which connects a drain of the enhancement type FET 2 and a source of the depletion type FET 4 of the second stage.

As shown in FIG. 6B, the DCFL inverter circuits INV1 and INV2 are formed between the interconnection layer 36b for supplying the power source voltage V$_{DD}$ and a ground interconnection layer 100. A left part corresponds to the DCFL inverter circuit INV1, and a right part corresponds to the DCFL inverter circuit INV2.

The gate electrode 31 of the DCFL inverter circuit INV1 is coupled to the common electrode 19 via the overgate portion 31a. This overgate portion 31a is also used as the overgate portion 30a of the gate electrode 30 of the DCFL inverter circuit INV2. In other words, in this embodiment, the overgate portion 31a is used in common as the overgate portion 31a of the DCFL inverter circuit INV1 and the overgate portion 30a of the DCFL inverter circuit INV2.

Figure 7:
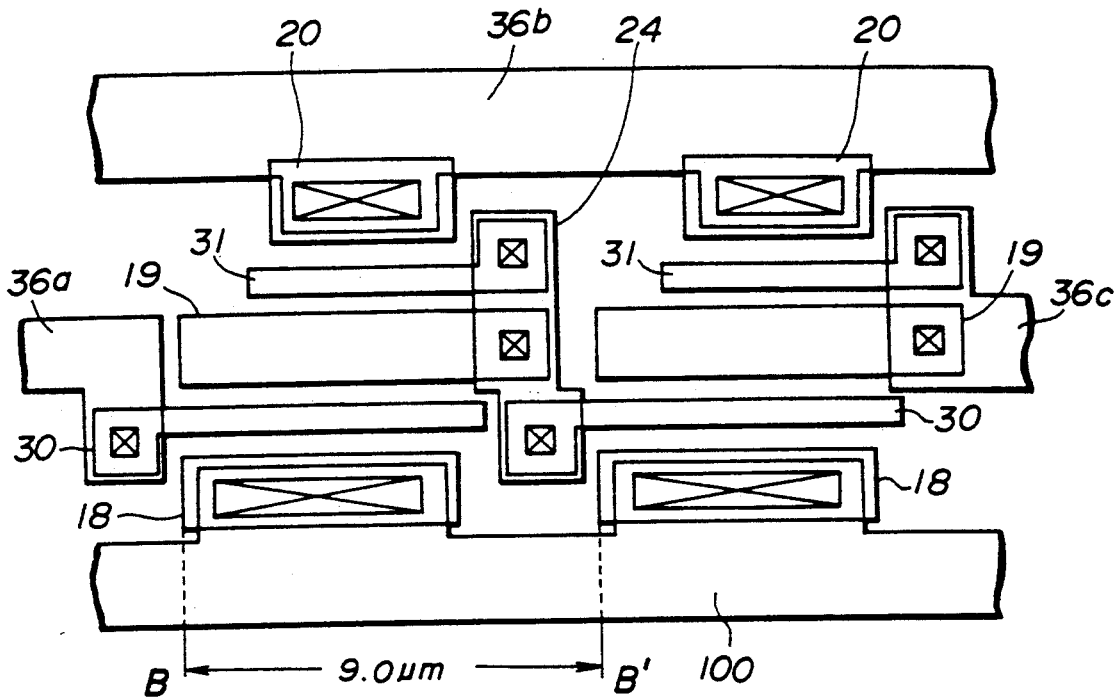
FIG. 7 is a plan view showing a conventional ring oscillator for comparing sizes with a ring oscillator realized in the second embodiment of the semiconductor device.

For comparison purposes, FIG. 7 shows a plan view of a conventional ring oscillator. In FIG. 7, those parts which are basically the same as those corresponding parts in FIGS. 2A, 2B and 6B are designated by the same reference numerals, and a description thereof will be omitted.

In FIG. 7, the DCFL inverter circuits INV1 and INV2 are connected by the interconnection layer 24. Accordingly, the interconnection layer 24 must be formed outside the element forming region. As a result, a distance between an end B of the source electrode 18 of the first stage to an end B, of the source electrode 18 of the second stage is approximately 9.0 μm.

On the other hand, in the embodiment shown in FIG. 6B, a distance between an end A of the source electrode 18 of the first stage to an end A' of the source electrode 18 of the second stage is approximately 7.5 μm which is small compared to the distance between the ends B and B, in FIG. 7. Hence, it may be seen that the area occupied by the semiconductor device can be reduced effectively according to this embodiment. In other words, since there is no need to provide special regions exclusively for connecting a plurality of circuits, it is possible to reduce the pitch with which the circuits are provided in the semiconductor device and therefore improve the integration density of the semiconductor device.

Next, a description will be given of a third embodiment of the semiconductor device according to the present invention, by referring to FIG. 8. In this embodiment, the present invention is applied to a gate array type semiconductor device.

Figure 8:
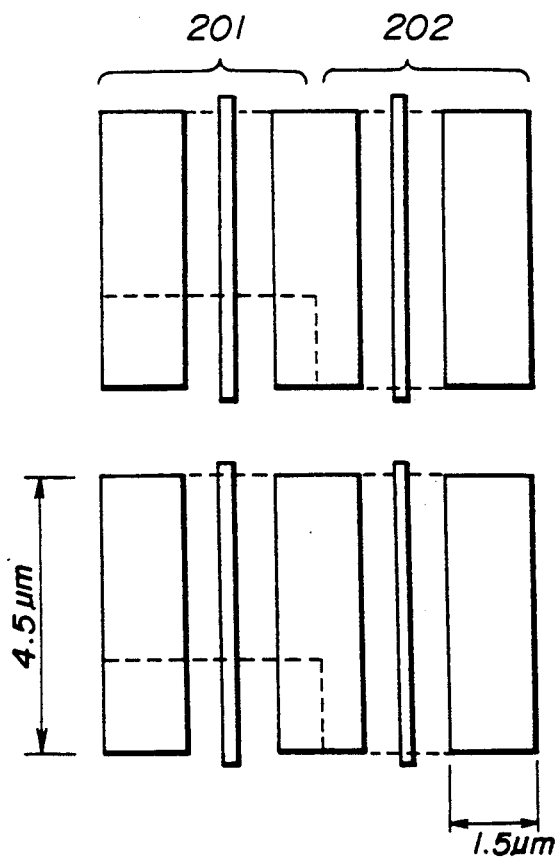
FIG. 8 is a plan view showing basic cells for explaining a third embodiment of the semiconductor device according to the present invention.

FIG. 8 is a plan view showing basic cells of the semiconductor device. The basic cells include depletion type cells 201 and enhancement type cells 202. In FIG. 8, a region indicated by a phantom line corresponds to an active region.

Figure 9:
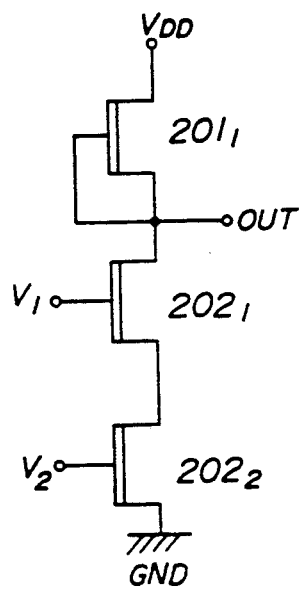
FIG. 9 is a circuit diagram showing a NAND circuit.
Figure 10:
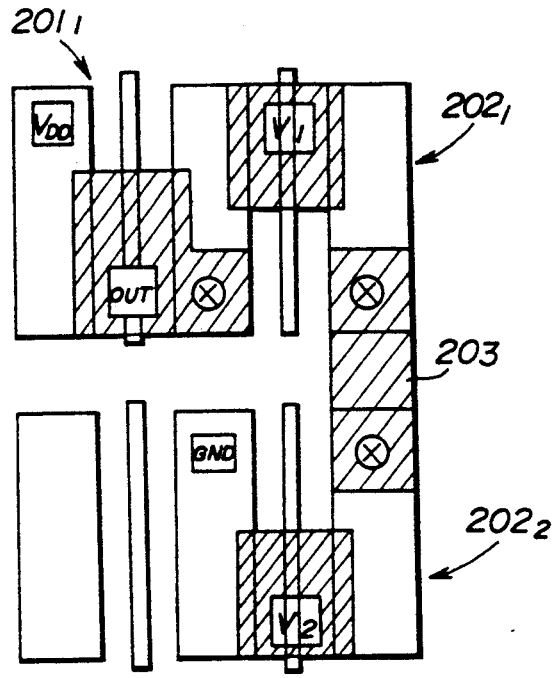
FIG. 10 is a plan view showing the NAND circuit realized by the third embodiment of the semiconductor device.

When using the basic cells shown in FIG. 8 to realize a 2-input NAND circuit shown in FIG. 9, contact holes are selectively formed and the connections are made as indicated by hatchings in FIG. 10. In FIG. 9, the NAND circuit includes a depletion type FET 201$_1$ and enhancement type FETs 202$_1$ and 202$_2$ which are connected as shown between the power source voltage V$_{DD}$ and the ground GND. Two input signals V1 and V2 are applied to the gates of the respective FETs 20$_2$ and 202$_2$, and an output signal OUT is obtained from a node which connects the FETs 201$_1$ and 202$_1$. In FIG. 10, a contact hole is formed to connect the overgate portion of the gate electrode and the source electrode of the FET 201$_1$. The overgate portion of the FET 201$_1$ connects to an upper interconnection layer (not shown) via a contact hole. An interconnection layer 203 is formed to connect the source electrode of the FET 202$_1$ to the drain electrode of the transistor 202$_2$ via respective contact holes. The source electrode of the FET 201$_1$ is used in common as the drain electrode of the FET 202$_1$. It may be seen from FIG. 10 that the overgate portion of the FETs 201$_1$, 202$_1$ and 202$_2$ are only formed partially on the respective gate contact portions so as to prevent unwanted contacts.

Figure 11:
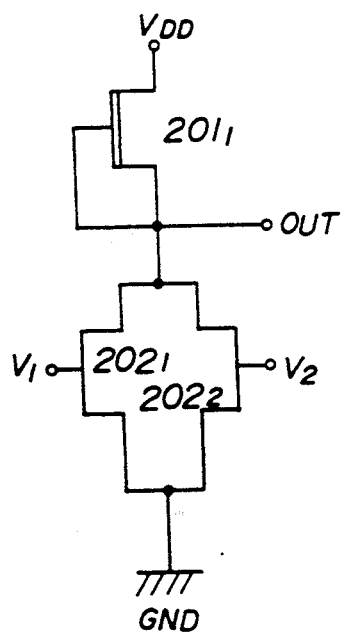
FIG. 11 is a circuit diagram showing a NOR circuit.
Figure 12:
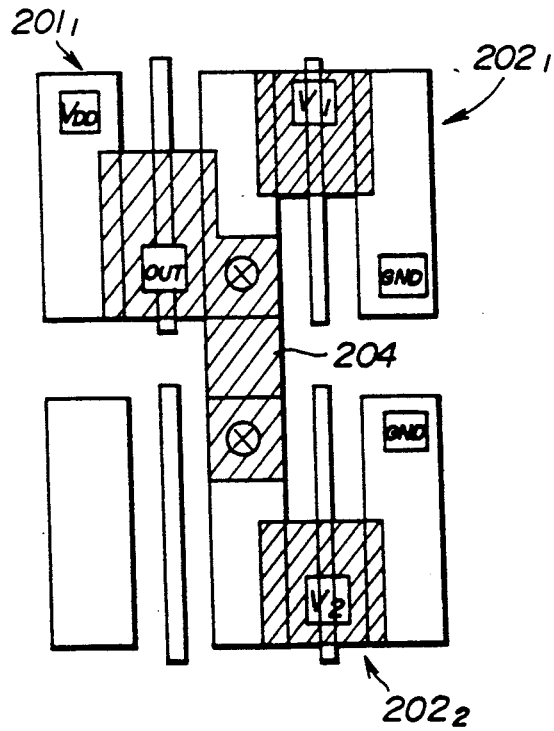
FIG. 12 is a plan view showing the NOR circuit realized by the third embodiment of the semiconductor device.

When using the basic cells shown in FIG. 8 to realize a 2-input NOR circuit shown in FIG. 11, contact holes are selectively formed and the connections are made as indicated by hatchings in FIG. 12. In FIG. 11, the NOR circuit includes the depletion type FET 201$_1$ and the enhancement type FETs 202$_1$ and 202$_2$ which are connected as shown between the power source voltage V$_{DD}$ and the ground GND. Two input signals V1 and V2 are applied to the gates of the respective FETs 202$_1$ and 202$_2$, and an output signal OUT is obtained from a node which connects the FETs 201$_1$, 202$_1$ and 202$_2$. In FIG. 12, a contact hole is formed to connect the overgate portion of the gate electrode and the source electrode of the FET $201_1$. An interconnection layer 204 is formed to connect the drain electrode of the FET $202_1$ to the drain electrode of the transistor $202_2$ via respective contact holes. The overgate portion of the FET $201_1$ is also connected to the interconnection layer 204 via a contact hole. The source electrode of the FET $201_1$ is used in common as the drain electrode of the FET $202_1$. It may be seen from FIG. 12 that the overgate portion of the FETs $201_1$, $202_1$ and $202_2$ are only formed partially on the respective gate contact portions so as to prevent unwanted contacts.

Figure 13:
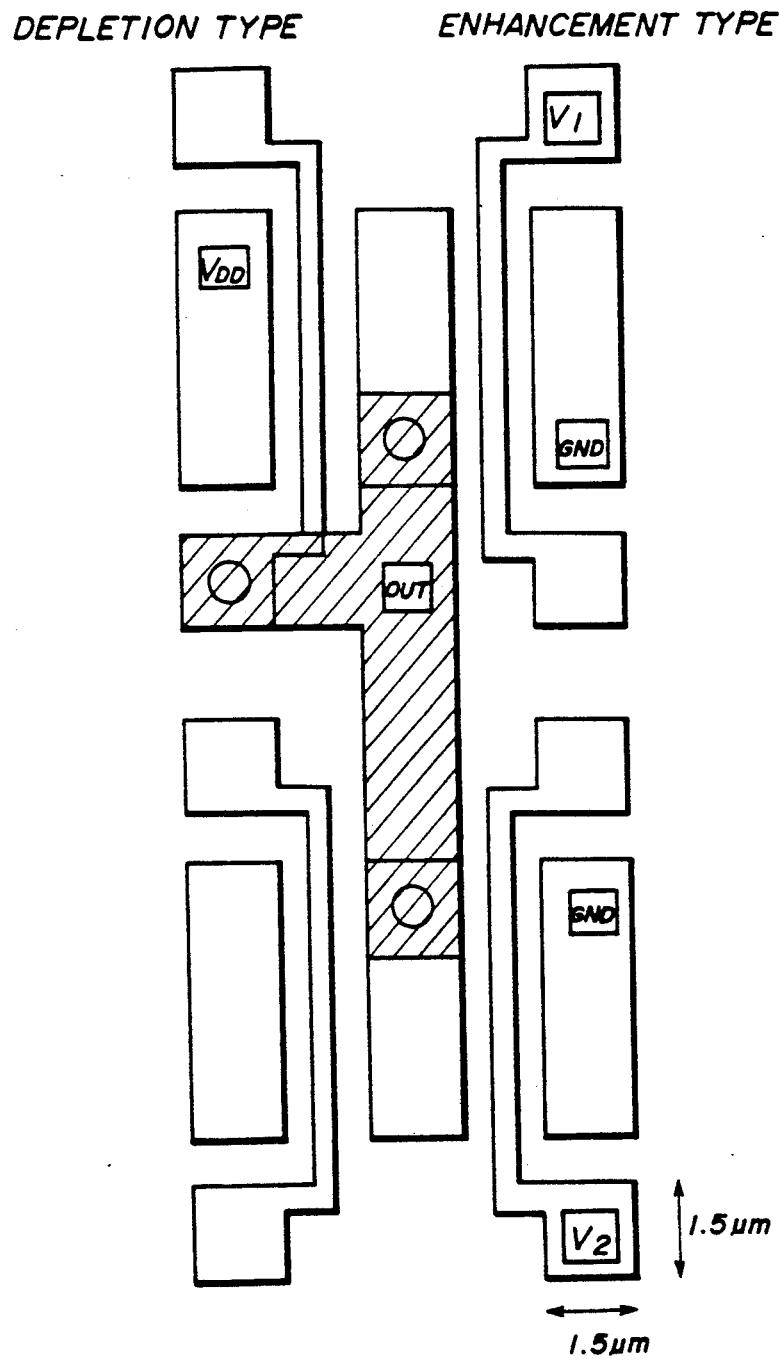
FIG. 13 is a plan view showing a conventional NOR circuit for comparing sizes with the NOR circuit realized in the third embodiment of the semiconductor device.

In FIGS. 10 and 12, the areas occupied by the NAND circuit and the NOR circuit respectively are approximately 78.75 $\mu m^2$ which is the area occupied by the basic cells shown in FIG. 8. But when a NOR circuit is formed by use of the conventional basic cells, the area occupied by the NOR circuit becomes approximately 146.25 $\mu m$ as shown in FIG. 13 because special regions are required exclusively for making the desired contacts. In this embodiment, the degree of freedom of designing the interconnections is large compared to the conventional semiconductor device because there is no need to provide a contact pad for making contact with the upper interconnection layer.

Therefore, according to the present invention, the following advantageous effects are obtainable. First, because the gate of the FET has the T-shaped cross section, it is possible to reduce the current density of the current passing through the gate without deteriorating the characteristic of the FET, it is possible to shorten the distance between the gate and source and the distance between the gate and drain of the FET, and it is also possible to realize a satisfactory connection between the gate and the source or drain of the FET. It should be noted that a direct connection of the gate and source or drain of the FET is not possible because the gate is usually made of Al or the like and makes contact with the active layer while the source or drain is usually made of Au or the like and makes ohmic contact with the active layer. Second, since the gate, source and drain electrodes of the FET have the same thickness, it is possible to form the gate, source and drain electrodes by a common process to simplify the production process and also ensure consistent characteristics of the FETs. Third, because a contact hole may be selectively formed to connect the gate to the source or drain of the FET, there is no need to form a contact pad exclusively for making contact and the degree of freedom of designing the interconnections is large without increasing the area occupied by the semiconductor device.

In the described embodiments, the present invention is applied to the FET having the recess gate structure. However, the present invention may be applied similarly to any Schottky gate FET, that is, to any semiconductor device in which the current easily flows through the gate electrode. For example, the present invention may be applied to metal oxide semiconductor FETs (MOSFETs), metal semiconductor FETs (MESFETs), metal insulator FETs (MISFETs) and high electron mobility transistors (HEMTs).

Further, the present invention is not limited to these embodiments, but various variations and modifications may be made without departing from the scope of the present invention.

What is claimed is:

1. A semiconductor device comprising:
a semiconductor substrate having a top surface;
an active layer formed on the top surface of said semiconductor substrate;
a source electrode and a drain electrode respectively formed on said active layer;
a gate electrode formed on said active layer between said source and drain electrodes, said gate electrode including a) a gate contact portion which makes contact with said active layer and has a thickness greater than thicknesses of said source and drain electrodes, said gate contact portion extending in a direction approximately perpendicular to the top surface of said semiconductor substrate, said gate contact portion having an upper part and b) an overgate portion which is integrally formed on an entire length of said upper part of said gate contact portion without the use of a contact hole and said overgate portion extends laterally to overlie at least a portion of one of said source and drain electrodes, said overgate portion extending in a direction approximately parallel to the top surface of said semiconductor substrate; and
a first insulator layer formed on said active layer and covering said source and drain electrodes and surrounding said gate contact portion of the gate electrode, said overgate portion being formed on said first insulator layer, said first insulator layer having a first contact hole through which said overgate portion connects said gate contact portion to said one of the source and drain electrodes.

2. The semiconductor device as claimed in claim 1, which further comprises a second insulator layer formed on said first insulator layer and covering said overgate portion, said second insulator layer having a second contact hole at a position above said overgate portion, and an interconnection layer formed on said second insulator layer and connected to said overgate portion via said second contact hole.

3. The semiconductor device as claimed in claim 1, wherein said source, drain and gate electrodes form electrodes of a Schottky gate field effect transistor.

4. The semiconductor device as claimed in claim 1, wherein said semiconductor substrate is made of semi-insulating GaAs, and said active layer is made of doped GaAs.

5. The semiconductor device as claimed in claim 1, wherein said overgate portion and said gate contact portion form an approximate T-shape in a cross section taken along a plane perpendicular to the top surface of said substrate.

6. A semiconductor device comprising:
a semiconductor substrate having a top surface;
an active layer formed on the top surface of said semiconductor substrate;
a first electrode, a second electrode and a third electrode respectively formed on said active layer;
a first gate electrode formed on said active layer between said first and second electrodes, said first gate electrode and said first and second electrodes forming electrodes of a first field effect transistor, said first gate electrode including a) a first gate contact portion which makes contact with said active layer and has a thickness greater than thicknesses of said first and second electrodes, said first gate contact portion extending in a direction approximately perpendicular to the top surface of said semiconductor substrate, and b) a first overgate portion which is integrally formed on an entire length of an upper part of said first gate contact portion without the use of a contact hole and said first overgate portion extends laterally to overlie at least a portion of said first electrode, said first overgate portion extending laterally in a direction approximately parallel to the top surface of said semiconductor substrate;

a second gate electrode formed on said active layer between said second and third electrodes, said second gate electrode and said second and third electrodes forming electrodes of a second field effect transistor, said second gate electrode including a) a second gate contact portion which makes contact with said active layer and has a thickness greater than thicknesses of said second and third electrodes, gate contact portion extending in a direction approximately perpendicular to the top surface of said semiconductor substrate, and b) a second overgate portion which is integrally formed on an entire length of an upper part of said second gate contact portion without the use of a contact hole and said second overgate portion extends laterally to overlie at least a portion of said second and third electrodes, said second overgate portion extending laterally in a direction approximately parallel to the top surface of said semiconductor substrate; and a first insulator layer formed on said active layer and covering said first, second and third electrodes and surrounding said first and second gate contact portions, said first and second overgate portions being formed on said first insulator layer, said first insulator layer having a first contact hole through which an overlying portion of said second overgate portion connects said second gate contact portion to said second electrode.

7. The semiconductor device as claimed in claim 6, which is further comprises a second insulator layer formed on said first insulator layer and covering said first overgate portion and said second overgate portion, said second insulator layer having a second contact hole at a position above said second overgate portion, and a first interconnection layer formed on said second insulator layer and connected to said second overgate portion via said second contact hole.

8. The semiconductor device as claimed in claim 7, which further comprises a third contact hole formed in said second insulator layer, and a second interconnection layer formed on said second insulator layer and connected to said first overgate portion via said third contact hole.

9. The semiconductor device as claimed in claim 8, which further comprises a fourth contact hole which penetrates said first and second insulator layers at a position above said third electrode, and a third interconnection layer formed on said second insulator layer and connected to said third electrode via said fourth contact hole.

10. The semiconductor device as claimed in claim 6, wherein said first field effect transistor is of an enhancement type using said first and second electrodes respectively as source and drain drain electrodes thereof, and said second field effect transistor is of a depletion type using said second and third electrodes respectively as source and drain electrodes thereof.

11. The semiconductor device as claimed in claim 6, wherein said first overgate portion and said first gate contact portion form an approximate T-shape in a cross section taken along a plane perpendicular to the top surface of said substrate.

12. The semiconductor device as claimed in claim 6, wherein said first and second field effect transistors form a group, and a plurality of such groups are provided on said active layer.

* * * * *